United States Patent
Bezold et al.

(10) Patent No.: US 11,162,778 B2
(45) Date of Patent: Nov. 2, 2021

(54) METHOD FOR DETERMINING MATERIAL REMOVAL AND DEVICE FOR THE BEAM MACHINING OF A WORKPIECE

(71) Applicant: Carl Zeiss SMT GmbH, Oberkochen (DE)

(72) Inventors: Steffen Bezold, Nuremberg (DE); Stephan Six, Augsburg (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 93 days.

(21) Appl. No.: 16/579,003

(22) Filed: Sep. 23, 2019

(65) Prior Publication Data

US 2020/0033115 A1    Jan. 30, 2020

Related U.S. Application Data

(63) Continuation of application No. PCT/EP2018/053178, filed on Feb. 8, 2018.

(30) Foreign Application Priority Data

Mar. 23, 2017    (DE) .................... 10 2017 204 861.1

(51) Int. Cl.
    *G01B 11/06*    (2006.01)
    *G01J 3/45*     (2006.01)
    (Continued)

(52) U.S. Cl.
    CPC ...... *G01B 11/0675* (2013.01); *G01B 11/0683* (2013.01); *G01J 3/45* (2013.01); *C03C 15/00* (2013.01); *H01J 37/3053* (2013.01)

(58) Field of Classification Search
    CPC ............ G01B 11/0675; G01B 11/0683; G01B 11/0625; G01J 3/45; C03C 15/00; H01J 37/3053
    See application file for complete search history.

(56) References Cited

U.S. PATENT DOCUMENTS 5,465,154 A    11/1995    Levy
5,980,767 A *  11/1999    Koshimizu ......... B81C 1/00587
                                                216/60

(Continued)

FOREIGN PATENT DOCUMENTS

DE    102015215851 A1    10/2015
WO    2010022754 A1      3/2010

OTHER PUBLICATIONS

International Search Report, PCT/EP2018/053178, dated Mar. 27, 2018, 4 pages.

(Continued)

*Primary Examiner* — Jonathan M Hansen
(74) *Attorney, Agent, or Firm* — Edell, Shapiro & Finnan LLC

(57) ABSTRACT

A method for determining material removal by an ion beam (3) on a test workpiece (7) which is disposed in a machining chamber (5) of a housing (6) of a device (1) for beam machining, wherein the test workpiece (7) has a substrate (8) and a layer (9) applied to the substrate. The method includes a) optically determining a layer thickness (d1) of the layer applied to the substrate, b) removing material of the layer from the test workpiece with the ion beam, c) optically determining the layer thickness (d2) of the layer applied to the substrate, and d) determining the material removal by comparing the layer thickness determined in step a) with the layer thickness determined in step c). Also disclosed is a device (1) for beam machining a workpiece (2) with which the method can be carried out.

16 Claims, 1 Drawing Sheet

(51) Int. Cl.
    *C03C 15/00*   (2006.01)
    *H01J 37/305*  (2006.01)

(56) References Cited

U.S. PATENT DOCUMENTS

| | | | | |
|---|---|---|---|---|
| 6,160,621 A | * | 12/2000 | Perry | G01B 11/0683 |
| | | | | 250/559.27 |
| 2001/0014520 A1 | * | 8/2001 | Usui | C23C 16/50 |
| | | | | 438/586 |
| 2003/0133124 A1 | | 7/2003 | Takahashi et al. | |
| 2013/0256262 A1 | * | 10/2013 | Hsiao | C23C 14/5873 |
| | | | | 216/37 |

OTHER PUBLICATIONS

Chang et al., "High-performance Spectral-domain Optical Low-coherence Reflectometry with an Integrated Arrayed-waveguide Grating", GLEO Technical Digest, 2012, 2 pages.
Jakob, "Coaxial interferometric measuring of layer thickness", Optical Measuring, 2000, 4 pages.
PCT International Preliminary Report on Patentability, PCT/EP2018/053178, dated Sep. 24, 2019, 8 pages.
German Office Action with English translation, file reference 10 2017 204.861.1, dated Dec. 5, 2017, 10 pages.

\* cited by examiner

METHOD FOR DETERMINING MATERIAL REMOVAL AND DEVICE FOR THE BEAM MACHINING OF A WORKPIECE

CROSS REFERENCE TO RELATED APPLICATIONS

This is a Continuation of International Application PCT/EP2018/053178, which has an international filing date of Feb. 8, 2018, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2017 204 861.1 filed on Mar. 23, 2017.

FIELD OF THE INVENTION

The invention relates to a method for determining material removal of a machining beam on a test workpiece, as well as to a device for beam machining a workpiece.

BACKGROUND

Contactless machining methods in which material is removed from the workpiece to be machined with a high-energy machining beam are often used for the machining of workpieces, in particular of optical elements, for example of lenses or of mirrors for lithographic systems. High precision in the machining is required in particular when machining optical elements for micro-lithography in order for the required accuracy of the surface shape to be achieved in the machining of the workpieces.

In order for the desired precision machining of a workpiece to be performed using a machining beam it is necessary for the material removal, or the material removal rate, respectively, that arises on the material to be machined at predefined settings of the beam source to be accurately determined. For this purpose it is known for the material removal, or the material removal rate, respectively, to be determined on a test workpiece prior to the machining of the workpiece.

In the case of a contactless removing machining method using a machining beam, for example in ion beam figuring (IBF), in electron beam machining or in laser machining, the workpiece is incorporated in a housing of a device for beam machining that encloses a machining chamber in which the beam machining can be carried out. It is typically necessary for a vacuum to be generated for the beam machining in the housing, or in the machining chamber, respectively.

In order for the test workpiece to be measured it is necessary for said test workpiece to be introduced into the housing, the test workpiece to be machined with the machining beam, and the test workpiece to be extracted from the housing again in order for said test workpiece to be measured at an interferometer measuring station. This can be very time-consuming since a plurality of machining passes of the test workpiece with subsequent interferometric measuring operations of the material removal arising herein are potentially required in the case of a modified setting of the beam tool, or of the beam parameters, respectively.

A method for determining the material removal when machining a workpiece with a beam tool is known from DE 10 2015 215 851 A1. In the case of the method, an oscillating crystal which is coated with the material of the workpiece, or which comprises the material of the workpiece, is provided, wherein the material of the workpiece is at least in part removed from the oscillating crystal with the beam tool, and the change in the natural frequency of the oscillating crystal on account of the material removal is determined. The oscillating crystal is disposed on a measuring position in a housing in which the beam machining takes place.

SUMMARY

It is an object of the invention to provide a method for determining a material removal as well as a device for beam machining, in which method and device the determination of the material removal can be carried out in a rapid and reliable manner.

According to one formulation, this and other objects are achieved by a method for determining a material removal by a machining beam on a test workpiece which is disposed in a machining chamber of a housing of a device for beam machining, wherein the test workpiece has a substrate and a layer applied to the substrate. The method includes: a) optically determining a layer thickness of the layer applied to the substrate, b) removing material of the layer of the test workpiece with the machining beam, c) optically determining the layer thickness of the layer applied to the substrate, and d) determining the material removal by comparing the layer thickness determined in step a) with the layer thickness determined in step c).

It is proposed according to the invention to perform the material removal on the test workpiece by optically measuring the layer thickness of a layer of the test workpiece which is disposed in the machining chamber of the device for beam machining, that is to say that the test workpiece for optical measuring is not retrieved from the machining chamber of the housing.

The method described here is therefore substantially faster and less complex that the conventional interferometric measuring of a test workpiece outside the housing since no introduction/extraction procedures are required and the machining of the test workpiece as well as the measuring of the material removal can be carried out at the same location in the machining chamber in the housing. Moreover, a higher accuracy as compared to conventional interferometric measuring methods can potentially be achieved since the determination of the material removal can be performed in the machining chamber immediately prior to the machining of the actual workpiece.

The optical measuring of the layer thickness of the layer of the substrate can be performed, for example, by (coaxial) interferometric layer thickness measuring as is described in the article "Koaxiale interferometrische Schichtdickenmessung" ("Coaxial interferometric layer thickness measuring"), Dr. Gerd Jakob, Photonik March 2000. This optical measuring technology is based on the reflection of radiation on the boundary surface between two media having dissimilar refraction indices, in the present case on the boundary surface between the substrate and the layer as well as between the layer and the environment, that is to say typically air or a vacuum (having a refraction index n=1.0). For the determination of the material removal it is typically sufficient for a single layer to be applied to the substrate; optionally, two or more layers of different materials can however also be applied to the substrate, the determination of the material removal being able to be performed on said two or more layers.

In one variant of the method, the test workpiece for determining the layer thickness in step a) and in step c) is irradiated with illumination radiation. The illumination source for illuminating the test workpiece can be disposed in the housing, or in the machining chamber, respectively; however, it is also possible for the illumination source to be disposed outside the housing and for the illumination radiation to be guided into the housing by way of a light conductor, for example by way of a glass fiber and a (vacuum) conduit. In both cases, an imaging optical unit can serve for focusing the illumination radiation on the test workpiece. In terms of interferometric layer thickness measuring it is favorable for the illumination radiation to be broadband. The wavelength range of the illumination radiation can be adapted to the wavelength range which can be detected by a spectrometer for recording an interference spectrum (see below). The spectrometer can detect a wavelength range between 190 nm and 1050 nm, for example, but it is not necessary for the illumination radiation to comprise the entire wavelength range.

In one refinement, the layer and the substrate of the test workpiece are transparent to the illumination radiation. The transparency of the layer is required for the interferometric layer thickness measuring. The transparency of the substrate is required for interferometric layer thickness measuring when the illumination of the test workpiece is performed from the rear side, that is to say from the side of the substrate that faces away from the layer. The illumination of the test workpiece from the rear side of the substrate is favorable since the machining of the test workpiece with the machining beam is performed on the front side of the substrate. The imaging optical unit can therefore be disposed so as to be stationary in the housing, or in the machining chamber, respectively. This is potentially impossible in the case of the disposal of the imaging optical unit on the front side of the substrate since the radiation source also has to be disposed there in order for the layer to be machined with the machining beam. Since the test workpiece has to be adjusted relative to the imaging optical unit, it is advantageous for the imaging optical unit to be disposed so as to be stationary in the housing.

In one further refinement, for optically determining the layer thickness in step a) and in step c) an interference spectrum of illumination radiation reflected on the test workpiece is recorded. As has been described earlier, the illumination radiation is reflected on the boundary surfaces between the layer and the substrate and between air and the layer, wherein the paths of the proportions of the illumination radiation reflected on the respective boundary surface differ, that is to say that a phase shift takes place between the two sub-beams. Should polychromatic illumination radiation impinge upon the layer, the phase shift varies as a function of the wavelength, that is to say that maxima and minima are displayed in an alternating manner in the spectrum, that is to say that an interference spectrum is generated. The layer thickness of the layer can be determined with the interference spectrum, for example by a Fourier analysis, as is described in more detail in the article cited above which is incorporated in its entirety into the content of this application by way of reference.

In a further variant, the illumination radiation reflected on the test workpiece for recording the interference spectrum is guided by way of a light conductor to a spectrometer disposed outside the housing. For reasons of installation space as well as for avoiding contamination, it is typically impossible for the spectrometer to be integrated in the housing of the device for beam machining, said housing typically being evacuated. It is therefore favorable for the reflected illumination radiation to be guided out of the housing by way of a light conductor which can have a plurality of portions which are configured, for example, in the manner of a glass fiber cable or the like, via a vacuum conduit. The spectrometer typically has a diffraction grating as well as a spatially-resolving detector for detecting the illumination radiation diffracted at the grating. While not mandatory, it is favorable for the illumination radiation to also be guided by way of the light conductor into the housing and to the test workpiece. In order for the illumination radiation from an illumination source to be coupled into the light conductor, said light conductor can be split or spliced, respectively. The illumination source can be integrated in the spectrometer or be disposed separately from the latter.

In one refinement, the reflected illumination radiation is coupled into the light conductor by way of an imaging optical unit. Such an imaging optical unit, for example in the manner of a lens, is typically required in order for the reflected illumination radiation to be coupled into the light conductor. When the illumination radiation is guided to the test workpiece via the light conductor the imaging optical unit can simultaneously be used for focusing the illumination radiation on the test workpiece.

In a further embodiment, the test workpiece when being disposed in the machining chamber (that is to say prior to the material removal with the machining beam) has a layer thickness between 0.1 µm and 20 µm. In the case of layers having layer thicknesses of this type (but potentially also having larger or smaller layer thicknesses), the layer thickness can be determined with the aid of interferometric layer thickness measurement. A large initial layer thickness of the layer of the test workpiece is favorable in order for repeated determining of the material removal to be enabled without the test workpiece having to be replaced for this purpose.

In one further refinement, the machining beam is selected from the group comprising: ion beam, electron beam, and laser beam. In principle, the method described here for determining the material removal can be carried out in the case of arbitrary contactless ablative beam machining methods, that is to say that said method is not limited to the types of machining beams described earlier.

A further aspect of the invention is implemented in a device for beam machining a workpiece using a machining beam, in particular for carrying out the method as described earlier, comprising: a radiation source for generating the machining beam, a housing in which a machining chamber for beam machining the workpiece is formed, at least one test workpiece which is disposed in the housing and comprises a substrate and a layer applied to the substrate, an illumination source for illuminating the test workpiece with illumination radiation, as well as a spectrometer which for recording an interference spectrum of illumination radiation reflected on the test workpiece is preferably disposed outside the housing.

The device according to the invention is configured for carrying out interferometric layer thickness measuring on the layer of the test workpiece disposed in the machining chamber of the housing. The material removal on the layer using optical layer thickness measuring can be determined in the manner described earlier in the context of the method. The illumination source is configured for generating polychromatic illumination radiation, that is to say, that said illumination source generates illumination radiation at a plurality of wavelengths and can be configured, for example, as a white light source or can comprise one or a plurality of filament lamps.

In one embodiment, the device comprises an evaluation unit for evaluating the interference spectrum for determining in each case a layer thickness of the layer applied to the substrate before and after machining the layer with the machining beam. As has been described earlier in the context of the method, the material removal can be determined by way of a comparison of the layer thickness of the layer prior to and after the machining with the machining beam, wherein the material removal typically corresponds to the difference between the layer thickness prior to and the layer thickness after the machining with the machining beam.

In one further embodiment, the device comprises a light conductor for guiding illumination radiation reflected back on the test workpiece to the spectrometer disposed outside the housing. As has been described earlier in the context of the method, the spectrometer is typically disposed outside the typically evacuated housing in which the machining chamber is formed. The back-reflected illumination radiation can be guided out of the housing by the light conductor by way of a vacuum conduit and for recording the interference spectrum be fed to the spectrometer.

In one refinement, the device has an imaging optical unit for coupling the reflected illumination radiation into the light conductor. The light conductor can be a (multi-mode) glass fiber, for example. As has been described earlier, the illumination radiation can also be guided to the test workpiece by way of the light conductor and with the aid of the imaging optical unit be focused on the test workpiece, in particular when the illumination source is disposed outside the housing. However, the illumination source can also be disposed in the typically evacuated housing, on account of which the light conductor, or light conductors, respectively, can be shortened and on account of which the light losses can be reduced. Also, a more homogeneous illumination of the test workpiece can potentially be generated by an illumination source that is disposed in the housing.

In one further embodiment, the substrate as well as the layer are transparent to the illumination radiation, wherein the substrate is preferably polished on both sides. The material of the substrate and the material of the layer can vary, as long as said materials are transparent to the wavelengths of the illumination radiation, or at least for a wavelength range of the illumination radiation that is sufficient for carrying out the layer thickness measuring. As has been described earlier, the substrate is mandatorily transparent to the illumination radiation only when the test workpiece is illuminated from the rear side. In this case, it is favorable for the substrate to be polished on both sides, that is to say on the front side as well as on the rear side, so as to avoid light losses on account of the scatter on surfaces of the substrate that are rough in the absence of such polishing.

In one further embodiment, the device additionally comprises a workpiece to be machined which is disposed in the machining chamber and preferably comprises a material which is identical to the material of the layer of the test workpiece. A material which is preferably identical to the material of the workpiece to be machined (in the case of ablative machining with a view to imparting shape) or of a layer applied to the workpiece (in the case of ablative machining with a view to decoating) is preferably used for the layer of the test workpiece.

In one embodiment, the device additionally comprises a shielding for protecting the test workpiece and/or the imaging optical unit when machining the workpiece with the machining beam. Direct sputtering (atomizing) of material of the workpiece or indirect sputtering of components attached in the machining chamber can arise in the machining of the workpiece with the machining beam. In order for the test workpiece, the imaging optical unit, and optionally the light conductor to be protected against removed particles, an annular shielding in which the test workpiece is disposed can be disposed in the machining chamber, for example.

The shielding can surround the test workpiece in a substantially annular manner, wherein no intermediate space or only a minor intermediate space remains between the shielding and the test workpiece. In this way, the test workpiece can serve as a "window", that is to say as part of the shielding, in order for the imaging optical unit as well as the light conductor to be protected. On account of the use of the shielding, only the layer of the test workpiece that is to be machined with the machining beam (i.e. the measured region) is ideally exposed to the machining chamber.

In one refinement, the shielding has a movable shutter which is movable between a first, closed, position and a second, opened, position. The shutter in the first, closed, position completely covers or obscures, respectively, the test workpiece, that is to say that the interior space of the shielding having the test workpiece is typically completely closed in relation to the machining chamber. The machining of the workpiece with the machining beam is therefore typically performed in the first position of the shutter. In the second, opened, position, the interior space of the shielding or else at least the layer of the test workpiece on which the material is removed, is accessible to the machining beam. The changeover between the two positions of the shutter can be performed with the aid of a drive. Alternatively or additionally, the (movable) radiation source, for example in the form of an ion source, in the switched-off state can enable a mechanical displacement of the shutter in that the radiation source is moved in the machining space such that said radiation source pushes against the shutter and displaces said shutter between the two positions.

In one further embodiment, the radiation source for generating the machining beam is selected from the group of: ion beam source, electron beam source, and laser source. As has been described earlier, all radiation sources which generate a machining beam which enables a contactless removal of material can be used in principle in the device.

Further features and advantages of the invention are derived from the description hereunder of exemplary embodiments of the invention, with reference to the figures of the drawing which show details relevant to the invention, and from the claims. The individual features may be realized in each case individually by themselves or as a plurality in any desired combination in a variant of the invention.

BRIEF DESCRIPTION OF THE DRAWINGS

Exemplary embodiments are illustrated in the schematic drawing and will be explained in the description hereunder. In the figures.

DETAILED DESCRIPTION

In the following description of the drawings, identical reference signs are used for identical or functionally identical components, respectively.

Figure 1:
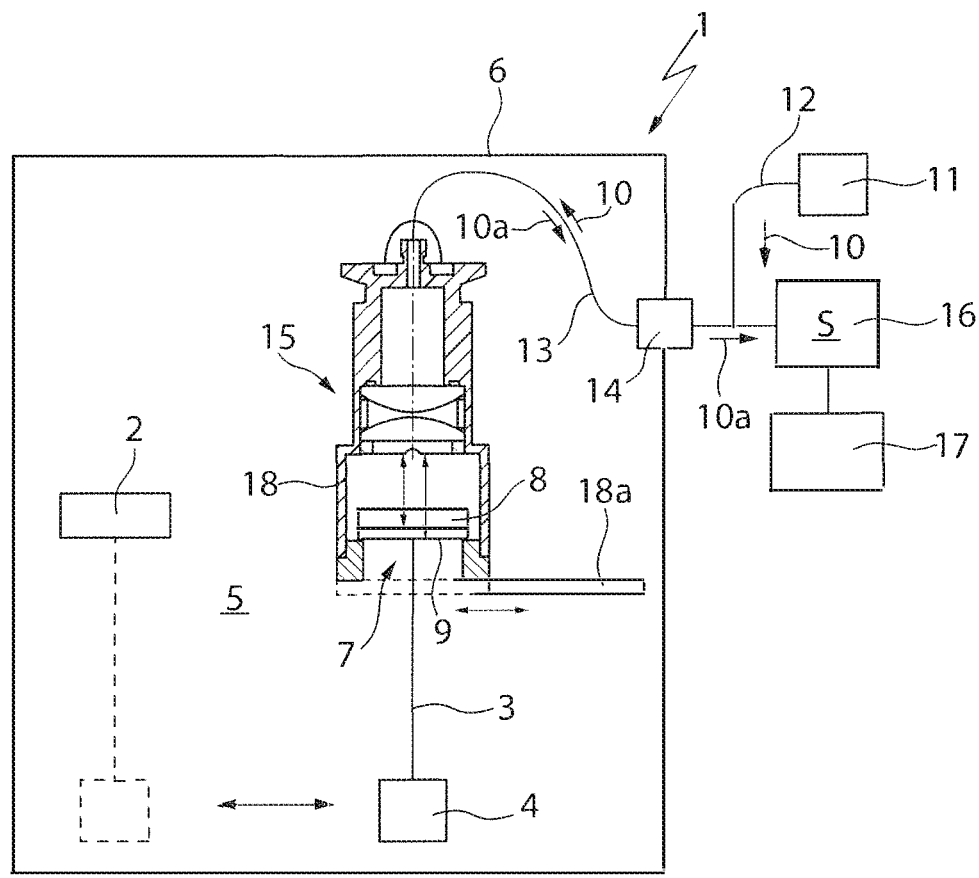
FIG. 1 shows a schematic illustration of a device for beam machining a workpiece with an ion beam.

FIG. 1 shows a device 1 for beam machining a workpiece 2 with a machining beam in the form of an ion beam 3 which is generated by a radiation source 4 in the form of an ion source. The workpiece 2 is disposed in a machining chamber 5 which is formed within a housing 6. The housing 6, more specifically the machining chamber 5, is evacuated with the aid of vacuum pumps (not shown), that is to say that a vacuum environment prevails in the housing 6.

In order for machining of the workpiece 2 in a manner as precise as possible to be enabled, said workpiece 2 in the case of the example shown being a quartz glass blank, it is favorable for the material removal of the ion beam 3 in the workpiece 2 (per unit of time) to be determined as accurately as possible. For this purpose, a test workpiece 7 which is formed from a substrate 8, in the example shown from Zerodur, and from a layer 9 from quartz glass that is applied to the substrate 8, is incorporated in the machining chamber 5. The material of the layer 9 is thus identical to the material of the workpiece 2.

In order for the material removal of the ion beam 3 on the layer 9 of the test workpiece 7 at a predefined irradiation duration to be determined, interferometric layer thickness measuring is performed on the layer 9 of the test workpiece 7. For this purpose, the test workpiece 7 on the rear side thereof, that is to say on that side that faces away from the layer 9, is irradiated with illumination radiation 10 which is generated by an illumination source 11 which is disposed outside the housing 6. The illumination source 11 in the example shown comprises two lamps which generate illumination radiation 10 at wavelengths between 190 nm and 1050 nm. The use of an illumination source 11 having two or more lamps has proven favorable when the illumination source 11 is to generate illumination radiation 10 in a wide spectral range, for example between 190 nm and 1050 nm, since the emission spectrum of a single lamp in this case does not cover the entire desired spectral range. The use of a wide spectral range of the illumination radiation 10 is particularly advantageous for layer thickness measuring on a very thin layer 9.

The illumination radiation 10 by way of a fiber portion 12 is coupled into a light conductor 13 in the form of a glass fiber, said light conductor by way of a vacuum conduit 14 in the housing 6 being guided into the machining chamber 5. The light conductor 13 at the end side is connected to the housing of an imaging optical unit 15 (lens) which serves for focusing the illumination radiation 10 onto the test workpiece 7. In the case of the example shown in FIG. 1, the illumination radiation 10 is beamed in so as to be substantially parallel to the thickness direction of the substrate 8, or of the layer 9, respectively.

The substrate 8 of the test workpiece 7 as well as the layer 9 are formed from a material that is transparent to the illumination radiation 10, that is to say that the illumination radiation 10 is substantially transmitted by the test workpiece 7. A minor proportion of the illumination radiation 10 is reflected by virtue of the respective difference in the refraction index on the boundary surface between the substrate 8 and the layer 9, as well as on the boundary surface between the layer 9 and the vacuum environment in the machining chamber 5. The illumination radiation 10a reflected back on the test workpiece 7 thus has two radiation proportions which have travelled different optical path lengths, as is in each case indicated by a double arrow in FIG. 1, on account of which a phase difference results.

The illumination radiation 10a reflected back on the test workpiece 7 is guided out of the housing 6 by way of the light conductor 13 and the vacuum conduit 14 and enters a spectrometer 16 which records an interference spectrum S of the reflected illumination radiation 10a. The reflected illumination radiation 10a in the spectrometer 16, in the example shown the Model MCS 601-c (UV-NIR) of the Carl Zeiss Spectroscopy company, impinges upon a diffraction grating and is divided into the spectral proportions thereof. The illumination radiation 10a diffracted at the diffraction grating is directed to a spatially-resolving detector. The layer thickness of the layer 9 can be determined from the interference spectrum S obtained with the spectrometer 16, for example by a Fourier analysis, as is described in the article "Koaxiale interferometrische Schichtdickenmessung" ("Coaxial interferometric layer thickness measuring"), Dr. Gerd Jakob, Photonik March 2000, cited at the outset. The spectrometer 16 for determining the layer thickness of the layer 9 is connected to an evaluation unit 17.

Figures 2A, 2B:
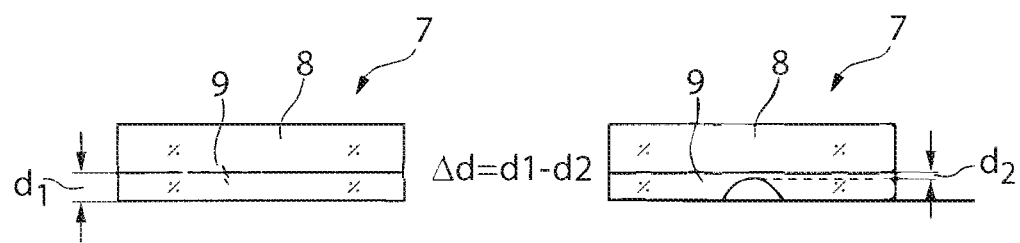
FIGS. 2A and 2B show schematic illustrations of a test workpiece prior to (FIG. 1A) and after (FIG. 2B) beam machining with the ion beam.

The procedure for determining the material removal $\Delta d$ of the ion beam 3 on the layer 9 is as described hereunder: The test workpiece 7 is first incorporated in the machining chamber 5 and adjusted relative to the imaging optical unit 15, that is to say that the spacing and the alignment of the test workpiece 7 in relation to the imaging optical unit 15 are set in a suitable manner. The layer thickness d1 of the test workpiece 7 is subsequently measured with the aid of the spectrometer 16 and of the evaluation unit 17 (cf. FIG. 2A), wherein d1=3 µm results in the example shown. Having determined the (original) layer thickness d1, the test workpiece 7 is machined with the ion beam 3 and material of the layer 9 is removed, as can be seen in FIG. 2B, on account of which a smaller layer thickness d2 results. The material removal on the layer 9 can be performed locally, as is illustrated in FIG. 2B; however, it is also possible for the material of the layer 9 to be removed in a homogeneous manner across the entire layer 9. A homogeneous removal of the material of the layer 9 has proven favorable since the result of the determination of the layer thickness d2 in the case of a homogeneous material removal is more stable in relation to positioning errors of the ion beam 3 as well as of the imaging optical unit 15.

After the machining of the layer 9 with the ion beam 3, a determination of the layer thickness d2 is again carried out in the spectrometer 16, or with the evaluation unit 17, respectively, wherein the layer thickness d2 of 1 µm shown in FIG. 2B is measured. The material removal $\Delta d$ results from comparing the layer thickness d1 of the layer 9 prior to the machining with the ion beam 3 and the layer thickness d2 after the machining with the ion beam 3, said material removal $\Delta d$ corresponding to the difference $\Delta d=d1-d2$ between the two layer thicknesses d1, d2.

The determination of the material removed $\Delta d$ on the layer 9 can optionally be carried out multiple times in the manner described earlier, wherein the parameters of the ion beam 3, for example the ion energy, are in each case varied in order for the workpiece 2 to be able to be machined as precisely as possible. It is favorable in particular in this case for the initial thickness of the layer 9 of the test workpiece 7 to be as large as possible, and to be d1=approx. 20 µm, for example.

As soon as the determination of the material removal $\Delta d$ has been completed, the machining of the workpiece 2 with the ion beam 3 can be performed. For this purpose, the ion source 4 is moved from the measuring position to a machining position which in FIG. 1 is illustrated by dashed lines, where the machining of the workpiece 2 with the ion beam 3 is performed.

Since the machining of the workpiece 2 can lead to sputtering (atomizing) of material of the workpiece 2, said material potentially being deposited on the test workpiece 7 as well as on the imaging optical unit 15, the entry-side part of the imaging optical unit 15 and also the test workpiece 7 are surrounded by an annular shielding 18. In the example shown in FIG. 1, the test workpiece 7 received in the shielding 18 serves as a "window" and thus as protection for the imaging optical unit 15. The test workpiece 7 per se is optionally not protected against deposits which are formed in the sputtering. In order for deposits which arise in the machining of the workpiece 2 to be removed from the test workpiece 7, a brief in-situ cleaning step of the test workpiece 7 can be carried out with the aid of the ion beam 3.

Alternatively or additionally, the shielding 18 can have a shutter 18*a* which is movable between a first, closed, position, illustrated by dashed lines in FIG. 1, and a second, opened, position, illustrated by a solid line in FIG. 1. The shutter 18*a* during the machining of the workpiece 2 with the ion beam 3 is typically in the closed position and is moved to the opened position when material is removed from the test workpiece 7 with the ion beam 3. The shutter 18*a* can be moved from the closed to the opened position and vice-versa in that the ion source 4 is suitably displaced in the machining chamber 5 such that said ion source 4 pushes against the shutter 18*a*. A drive, or an actuator, respectively for moving the shutter 18*a* in the machining chamber 5 can also be provided in the machining chamber 5. It is understood that the shutter 18*a* does not have to be mandatorily displaced between the first and the second position, but can carry out another type of movement, for example a rotating movement.

It is understood that the determination of the material removal Δd can also be carried out by another type of machining beam which enables a contactless removal of material, for example an electron beam or a laser beam. As opposed to the illustration in FIG. 1, the illumination source 11 can be integrated in the evacuated machining chamber 5 of the housing 6 so as to achieve a more homogeneous illumination of the test workpiece 7 with the illumination radiation 10.

In order for the test workpiece 7 not to have to be replaced too frequently, to which end said test workpiece 7 has to be retrieved by venting and opening the housing 6 and substituted by a further test workpiece 7, a plurality of test workpieces 7 can optionally be disposed in a magazine in the machining chamber 5, only one of said plurality of test workpieces 7 being in each case measured and disposed on the measuring position, illustrated in FIG. 1, in the machining chamber 5. The magazine can be configured in the manner of a rotary plate, for example, as is described in DE 10 2015 215 851 A1 which is cited at the outset and is incorporated in its entirety into this application by way of reference. A vacuum lock can be used for introducing and extracting the test workpiece 7 into the housing 6 or from the housing 6, respectively, said vacuum lock being different from a vacuum lock for introducing and extracting the workpiece 2, so as to avoid any stoppage in the machining of the workpiece 2 when the test workpiece 7 is being replaced.

What is claimed is:

1. A method for determining a material removal (Δd) by an ion beam on a test workpiece which is disposed in a machining chamber of a housing of a device for beam machining, wherein the test workpiece has a substrate and a layer applied to the substrate and wherein the machining chamber has an imaging optical unit having an entry-side part, and has a shielding annularly surrounding the entry-side part of the imaging optical unit and the test workpiece, the method comprising:
   a) optically determining, initially, a layer thickness (d1) of the layer applied to the substrate,
   b) removing material of the layer of the test workpiece with the ion beam,
   c) optically determining the layer thickness (d2) of the layer applied to the substrate subsequent to said removing, and
   d) determining the material removal (Δd) by comparing the layer thickness (d1) determined in said initial determining with the layer thickness (d2) determined in said subsequent determining,
   wherein a workpiece, to be machined, is disposed in the machining chamber; and
   wherein the shielding protects the test workpiece and the entry-side part of the imaging optical unit during machining of the workpiece with the ion beam.

2. The method as claimed in claim 1, wherein said initial determining and said subsequent determining comprises irradiating the test workpiece with illumination radiation.

3. The method as claimed in claim 2, wherein the layer and the substrate of the test workpiece are transparent to the illumination radiation.

4. The method as claimed in claim 2, wherein said initial determining and said subsequent determining comprise recording an interference spectrum of the illumination radiation reflected on the test workpiece.

5. The method as claimed in claim 4, further comprising guiding the illumination radiation reflected on the test workpiece for recording the interference spectrum by way of a light conductor to a spectrometer disposed outside the housing.

6. The method as claimed in claim 5, wherein the reflected illumination radiation is coupled into the light conductor by way of the imaging optical unit.

7. The method as claimed in claim 1, wherein the layer thickness (d1) is between 0.1 μm and 20 μm.

8. A device for beam machining a workpiece with an ion beam, comprising:
   an ion beam source generating the ion beam,
   a housing in which a machining chamber for beam machining the workpiece is formed, at least one test workpiece disposed in the housing and comprising a substrate and a layer applied to the substrate,
   an illumination source illuminating the test workpiece with illumination radiation,
   a spectrometer recording an interference spectrum of illumination radiation reflected on the test workpiece
   a workpiece, to be machined, disposed in the machining chamber,
   an imaging optical unit having an entry-side part and arranged relative to the test workpiece, and a shielding annularly surrounding and protecting the test workpiece and the entry-side part of the imaging optical unit when the workpiece is machined with the ion beam.

9. The device as claimed in claim 8, wherein the spectrometer is disposed outside the housing.

10. The device as claimed in claim 8, further comprising: an evaluation unit configured to evaluate the interference spectrum for determining in each case a layer thickness (d1, d2) of the layer applied to the substrate before and after machining the layer with the ion beam.

11. The device as claimed in claim 8, further comprising: a light conductor for guiding illumination radiation reflected back on the test workpiece to the spectrometer disposed outside the housing.

12. The device as claimed in claim 11, further comprising: an imaging optical unit for coupling the reflected illumination radiation into the light conductor.

13. The device as claimed in claim 8, wherein the substrate and the layer are transparent to the illumination radiation.

14. The device as claimed in claim 8, wherein the substrate is polished on both sides thereof.

15. The device as claimed in claim 8, wherein the workpiece to be machined comprises a material which is identical to the material of the layer of the test workpiece.

16. The device as claimed in claim 8, wherein the shielding has a shutter which is movable between a first, closed position and a second, opened position.

* * * * *